United States Patent
Su et al.

(10) Patent No.: US 12,260,320 B2
(45) Date of Patent: Mar. 25, 2025

(54) DYNAMIC DESIGN METHOD TO IMPROVE THE ADAPTABILITY OF ACCELERATION UNITS TO NEURAL NETWORKS

(71) Applicant: NATIONAL TAIWAN UNIVERSITY OF SCIENCE AND TECHNOLOGY, Taipei (TW)

(72) Inventors: Shun-Feng Su, Taipei (TW); Meng-Wei Chang, Taipei (TW)

(73) Assignee: NATIONAL TAIWAN UNIVERSITY OF SCIENCE & TECHNOLOGY, Taipei (TW)

( * ) Notice: Subject to any disclaimer, the term of this patent is extended or adjusted under 35 U.S.C. 154(b) by 939 days.

(21) Appl. No.: 17/363,141

(22) Filed: Jun. 30, 2021

(65) Prior Publication Data

US 2022/0284272 A1 Sep. 8, 2022

(30) Foreign Application Priority Data

Mar. 5, 2021 (TW) ................................. 110107860

(51) Int. Cl.
*G06N 3/063* (2023.01)
*G06F 7/523* (2006.01)
(Continued)

(52) U.S. Cl.
CPC ............. *G06N 3/063* (2013.01); *G06F 7/523* (2013.01); *G06F 7/535* (2013.01); *G06F 9/5027* (2013.01); *G06F 17/16* (2013.01)

(58) Field of Classification Search
CPC ......... G06N 3/063; G06F 7/523; G06F 7/535; G06F 9/5027; G06F 17/16; G06F 30/34; G06F 15/7867; G06F 30/327
See application file for complete search history.

(56) References Cited

U.S. PATENT DOCUMENTS

| 2014/0258199 A1* | 9/2014 | Modha ................... G06N 3/049 706/26 |
| 2019/0042529 A1* | 2/2019 | Nurvitadhi .......... G06F 15/7867 |
| 2023/0004775 A1* | 1/2023 | Bourge .................. G06N 3/105 |

OTHER PUBLICATIONS

Vucha, Mahendra, and Arvind Rajawat. "Design and FPGA implementation of systolic array architecture for matrix multiplication." International Journal of Computer Applications 26.3 (2011): 18-22. (Year: 2011).*

(Continued)

*Primary Examiner* — Michael W Ayers
*Assistant Examiner* — Nicholas S Wu
(74) *Attorney, Agent, or Firm* — BACON & THOMAS, PLLC

(57) ABSTRACT

A method is disclosed to dynamically design acceleration units of neural networks. The method comprises steps of generating plural circuit description files through a neural network model; reading a model weight of the neural network model to determine a model data format of the neural network model; selecting one circuit description file from the plural circuit description files according to the model data format, so that the chip is reconfigured according to the selected circuit description file to form an acceleration unit adapted to the model data format. The acceleration unit is suitable for running a data segmentation algorithm, which may accelerate the inference process of the neural network model. Through this method the chip may be dynamically reconfigured into an efficient acceleration unit for the different model data format, thereby speeding up the inference process of the neural network model.

6 Claims, 8 Drawing Sheets

(51) Int. Cl.
G06F 7/535 (2006.01)
G06F 9/50 (2006.01)
G06F 17/16 (2006.01)
G06F 30/327 (2020.01)
G06F 30/34 (2020.01)

(56) References Cited

OTHER PUBLICATIONS

Wang, Ying, et al. "DeepBurning: Automatic generation of FPGA-based learning accelerators for the neural network family." Proceedings of the 53rd Annual Design Automation Conference. 2016. (Year: 2016).*

Pullini, Antonio, et al. "A heterogeneous multicore system on chip for energy efficient brain inspired computing." IEEE Transactions on Circuits and Systems II: Express Briefs 65.8 (2017): 1094-1098. (Year: 2017).*

Li, Yufeng, et al. "High-performance convolutional neural network accelerator based on systolic arrays and quantization." 2019 IEEE 4th International Conference on Signal and Image Processing (ICSIP). IEEE, 2019. (Year: 2019).*

Ashraf, Rizwan A., and Ronald F. DeMara. "Scalable FPGA refurbishment using netlist-driven evolutionary algorithms." IEEE Transactions on Computers 62.8 (2013): 1526-1541. (Year: 2013).*

\* cited by examiner

```
root@trs96v2-oob-2019_2:/run/media/mmcblk0p1# ./gemm.exe mmlt.xclbin
Found Platform
Platform Name: Xilinx
binaryFile: mmlt.xclbinMY_MULT = {
m:4,n:4,k:4
lda:4,ldb:4,ldc:4
INFO: Reading mmlt.xclbin
Loading: 'mmlt.xclbin'
```

```
Hardware systolic 4x4 FPGA Global Memory to Device Memory timer = 1244 us
Matrix data exchange C:Result Total Matrix M=4 N=4
14  20  26  32
20  30  40  50
26  40  54  68
32  50  68  86

Simulation systolic 4x4 FPGA Global Memory to Device Memory timer = 9 us
Matrix data exchange C:Result Total Matrix M=4 N=4
14  20  26  32
20  30  40  50
26  40  54  68
32  50  68  86

ARM timer = 1 us
C:Result Total Matrix M=4 N=4
14  20  26  32
20  30  40  50
26  40  54  68
32  50  68  86
```

FIG. 5C

DYNAMIC DESIGN METHOD TO IMPROVE THE ADAPTABILITY OF ACCELERATION UNITS TO NEURAL NETWORKS

BACKGROUND OF THE INVENTION

(1) Field of the Invention

The present invention relates to a circuit design method, in particular to a method of reconfiguring a circuit through dynamic programming.

(2) Description of the Prior Art

The accuracy, energy consumption, throughput, delay and cost are key indicators for the circuit design of an edge inference chip. Based on these key indicators, it is to establish an important question about "how to design hardware chip effectively or accelerate the existing neural network".

FIG. 1A is a schematic diagram of performing machine learning inference by a traditional central processing unit (referred to as CPU). FIG. 1B is a schematic diagram of performing machine learning inference by Facebook's Glow neural network compiler cooperated with a hardware accelerator. In the past, some developers hoped to merge a field-programmable gate array (referred to as FPGA) and an application-specific integrated circuit architecture (referred to as ASIC) into a traditional CPU to implement a whole neural network model on the traditional CPU, so as to speed up inference calculations. However, from the comparison of FIG. 1A and FIG. 1B, a more forward-looking approach is to use heterogeneous multi-processing accelerators for machine learning inference of the neural network.

With the advancement of the integrated circuit manufacturing technologies, the latest process design is continuously adopted, so as to make the tape-out cost of each integrated circuit (referred to as IC) be getting higher and higher. Moreover, most consumer chip designs and computing circuit architectures adopt ASIC architecture for one-time design only.

Known technologies such as TW Patent No. 1686711 "Method and Computer Storage Medium for Performing Neural Network Computations, and Neural Network System" employed ASIC architecture as main design method and use high-speed bus such as PCI Express Bus to communicate and exchange in the peripheral input/output interface (referred to as I/O). In the industry, a manufacturing process of ASIC architecture is generally used to improve overall computing efficiency and wiring area. However, most advanced RISC machines (referred to as ARMs), such as Cortex-A, Cortex-R, Cortex-M series, have no high-speed bus, so the integrated circuit design of ARMs must add extra intellectual property cores (referred to as "IP core") or silicon intellectual property (referred to as SIP) related to high-speed buses. That will generate extra design or authorization fees, and will also occupy the area for the circuit design on the chip.

In addition, regarding the operation and design of image algorithm models, since most foundations of image recognition need to convolve images, enhance features or sampling, they may be classified into some different neural network models such as image classification models, object detection models, image segmentation models, generative adversarial network models (referred to as GAN), image caption generator models, image colorization models, etc. according to required tasks and applications. However, the difference in model design will cause computational burden.

Accordingly, if a new circuit design method and computing architecture can be provided for the applications of edge computing chips, cloud training chips and existing consumer chips to solve the above problems, it should be able to meet market demand.

SUMMARY OF THE INVENTION

One object of the present invention is to provide a dynamic design method to form an acceleration unit of a neural network, wherein the method can improve the use efficiency and the life cycle of chips, amortize the cost of tape-out, and reduce the computational burden caused by different model designs.

In order to achieve the aforementioned object, the present invention provides a dynamic design method to form acceleration units of neural networks. The dynamic design method comprises steps of: providing a neural network model and a chip, wherein the neural network model comprises a model weight; generating plural circuit description files through the neural network model; reading the model weight of the neural network model to determine a model data format of the neural network model; selecting one circuit description file from the plural circuit description files according to the model data format; and reconfiguring the chip to form an acceleration unit adapted to the model data format according to the selected circuit description file, wherein the acceleration unit is suitable for running a data segmentation algorithm.

In an embodiment, each of the plural circuit description files comprises a data format corresponding to the acceleration unit, and a circuit logic related to the data segmentation algorithm.

In an embodiment, the model data format and the data format corresponding to the acceleration unit may be int 8, int 16, int 32, float 8, float 16, float 32 or BFloat16.

In an embodiment, the reconfiguring the chip comprises steps of: providing a basic platform circuit; configuring a file system related to the model data format; synthesizing a core circuit according to the circuit logic related to the data segmentation algorithm; and transplanting the file system and the core circuit to the basic platform circuit to form the acceleration unit.

In an embodiment, the data segmentation algorithm comprises: providing a first matrix and a second matrix; dividing the first matrix into a plurality of first data blocks, and dividing the second matrix into a plurality of second data blocks; and performing a matrix multiplication operation on the first data blocks and the second data blocks through a plurality of processing elements.

In an embodiment, the acceleration unit comprises a heterogeneous multi-core architecture, which is a hybrid dynamic circuit including a processing system integrated with a programmable logic.

The present invention implements a domain specific system-on-chip by dynamic reconfiguring a chip whose circuit can be redefined through software methods, so as to make the chip become an efficient processor for a specific data format. The dynamic reconfiguration can improve the use efficiency of chips, increase the market cycle of chips and amortize the one-time cost of tape-out. It is suitable for edge computing chips, cloud training chips, and existing consumer chips.

BRIEF DESCRIPTION OF THE DRAWINGS

FIG. 5A shows a screen of the application program execution stage of the embodiment applying the present invention.

FIG. 5B shows an input matrix of the embodiment applying the present invention.

FIG. 5C shows the result of the matrix multiplication operation of the embodiment applying the present invention.

DESCRIPTION OF THE PREFERRED EMBODIMENTS

Regarding technical contents, features and effects disclosed above and other technical contents, features and effects of the present invention will be clearly presented and manifested in the following detailed description of the exemplary preferred embodiments with reference to the accompanying drawings which form a part hereof.

Figure 1B:
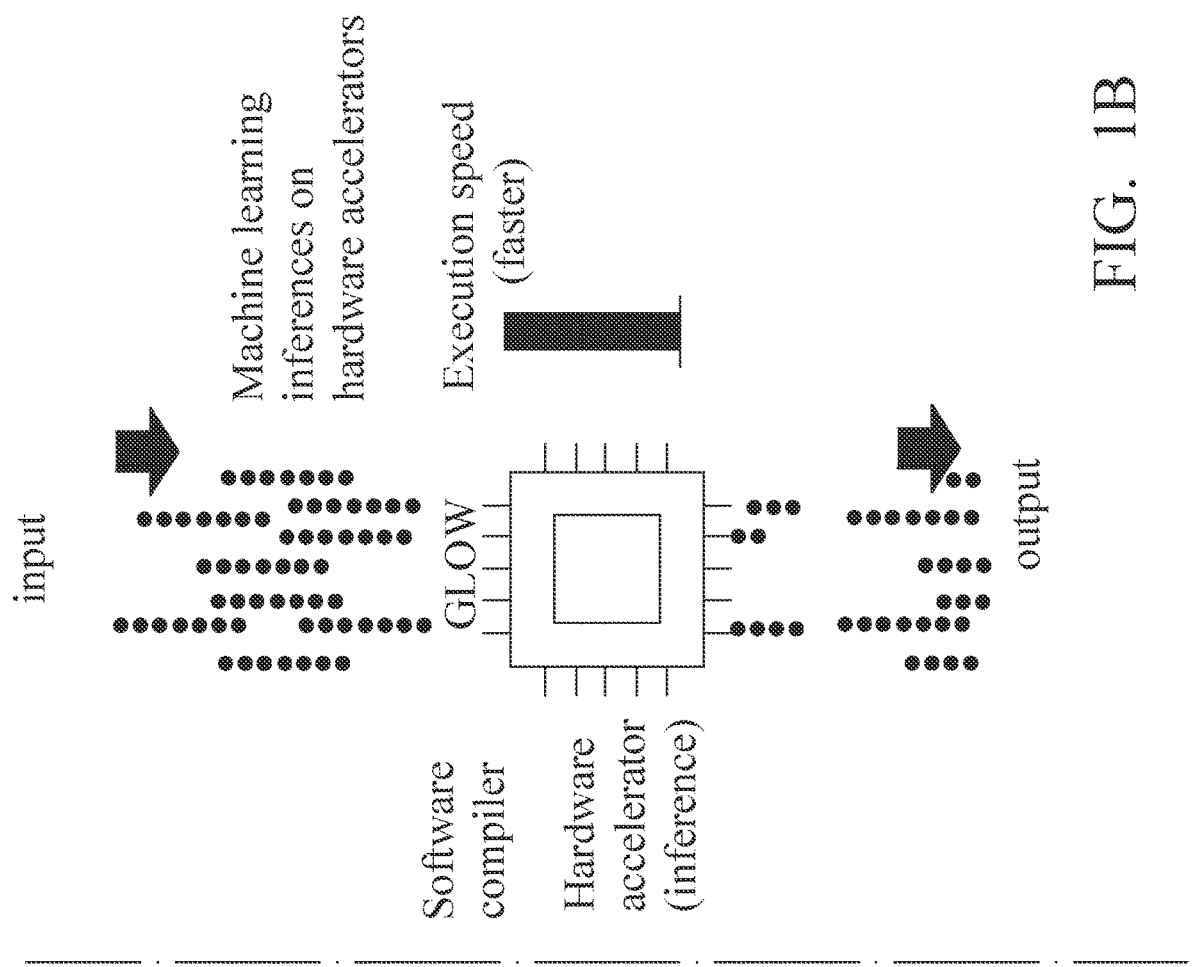
FIG. 1B is a schematic diagram of machine learning inference performed by a software compiler cooperated with a hardware accelerator.
Figure 1A:
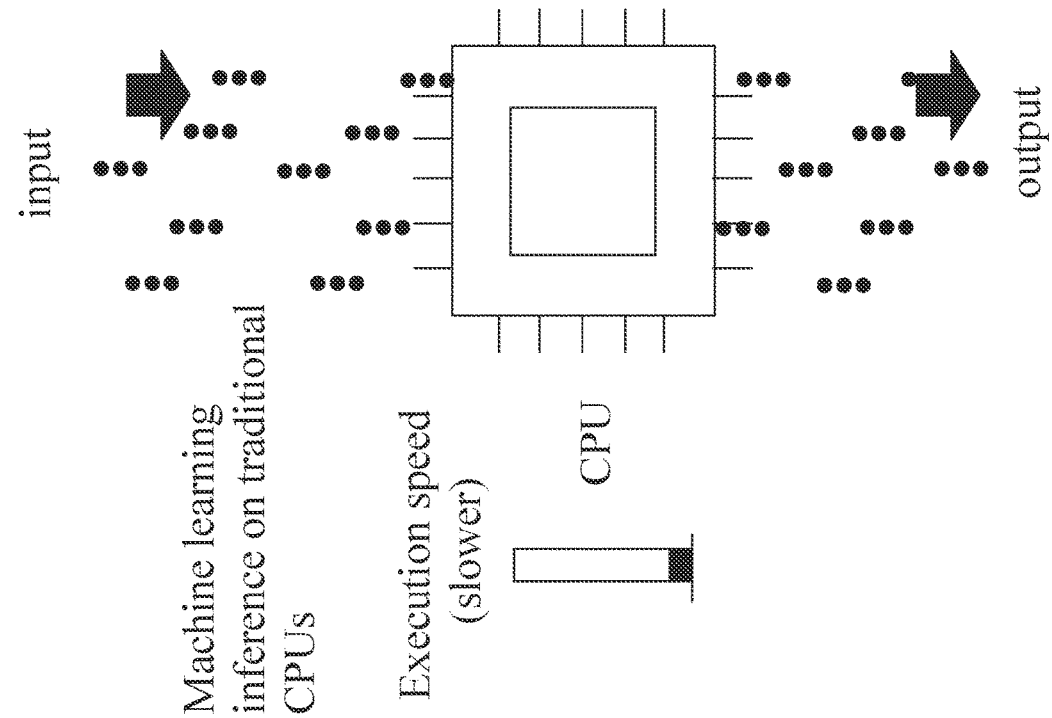
FIG. 1A is a schematic diagram of machine learning inference performed by a traditional central processing unit.
Figure 2:
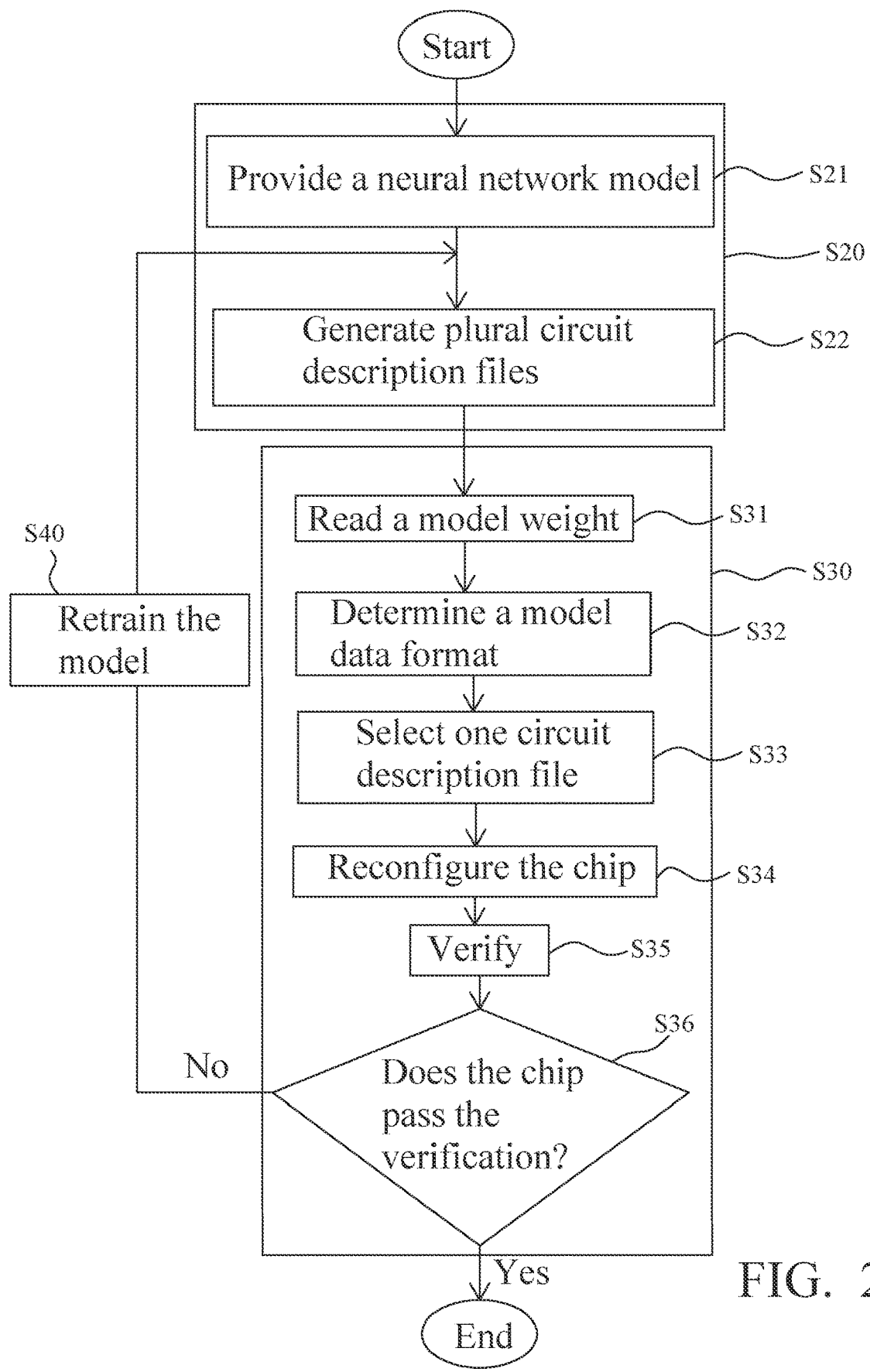
FIG. 2 is a flowchart of a dynamic design method to form an acceleration unit of a neural network according to an embodiment of the present invention.

FIG. 2 is a flowchart of a dynamic design method to design an acceleration unit of a neural network according to one embodiment of the present invention. In the embodiment, the acceleration unit is designed based on a systolic array architecture. A software framework is employed to interpret a data format of a model weight of the neural network to cooperate with a software-defined hardware chip, so as to dynamically form the acceleration unit with optimized circuit. In the embodiment, the analysis of data format is processed in parallel to the algorithm of the systolic array architecture to make the acceleration unit perform optimized operation, thereby providing a circuit deployment suitable for silicon intellectual property (referred to as SIP) of ARMs architecture.

As shown in FIG. 2, in a pre-development stage (S20), an inferred neural network model is provided in advance (S21), for example, an open-source neural network model. A plurality of different circuit description files are generated through the neural network model (S22), and each of the circuit description files defines a data format corresponding to an acceleration unit and a circuit logic related to a data segmentation algorithm.

Next, in the stage of an operating system executing the application programs (S30), also called "application runtime stage", the steps S31-S36 in the stage (S30) can be implemented by developing a deep learning framework. The deep learning framework reads the model weight of the neural network model (S31), to determine or identify a model data format of the neural network model according to the model weight (S32). The determined model data format is compared with the data format defined in each of the circuit description files to select one circuit description file corresponding to the model data format from these circuit description files (S33). In the embodiment, the data format corresponding to the acceleration unit or the model data format may adopt, for example, but not limited to int 8, int 16, int 32, float 8, float 16, float 32, BFloat16, etc. In other words, any data format suitable for artificial intelligence training and inference models developed at present or in the future may be employed in the concept of the present invention.

It is worth noting that in step (S33), there will be a difference from the traditional technology using FPGA. Generally speaking, most deep learning frameworks is capable of reading the model weights. However, the present invention further determines the model data format through the process of reading the model weights, and dynamically reconfigures the circuit. Specifically, after reading the model weights, the weight data is moved to the memory, then the type of the model data format is checked, and the process shown in FIG. 3 is performed afterwards, to achieve dynamically adaptive circuit planning.

Figure 3:
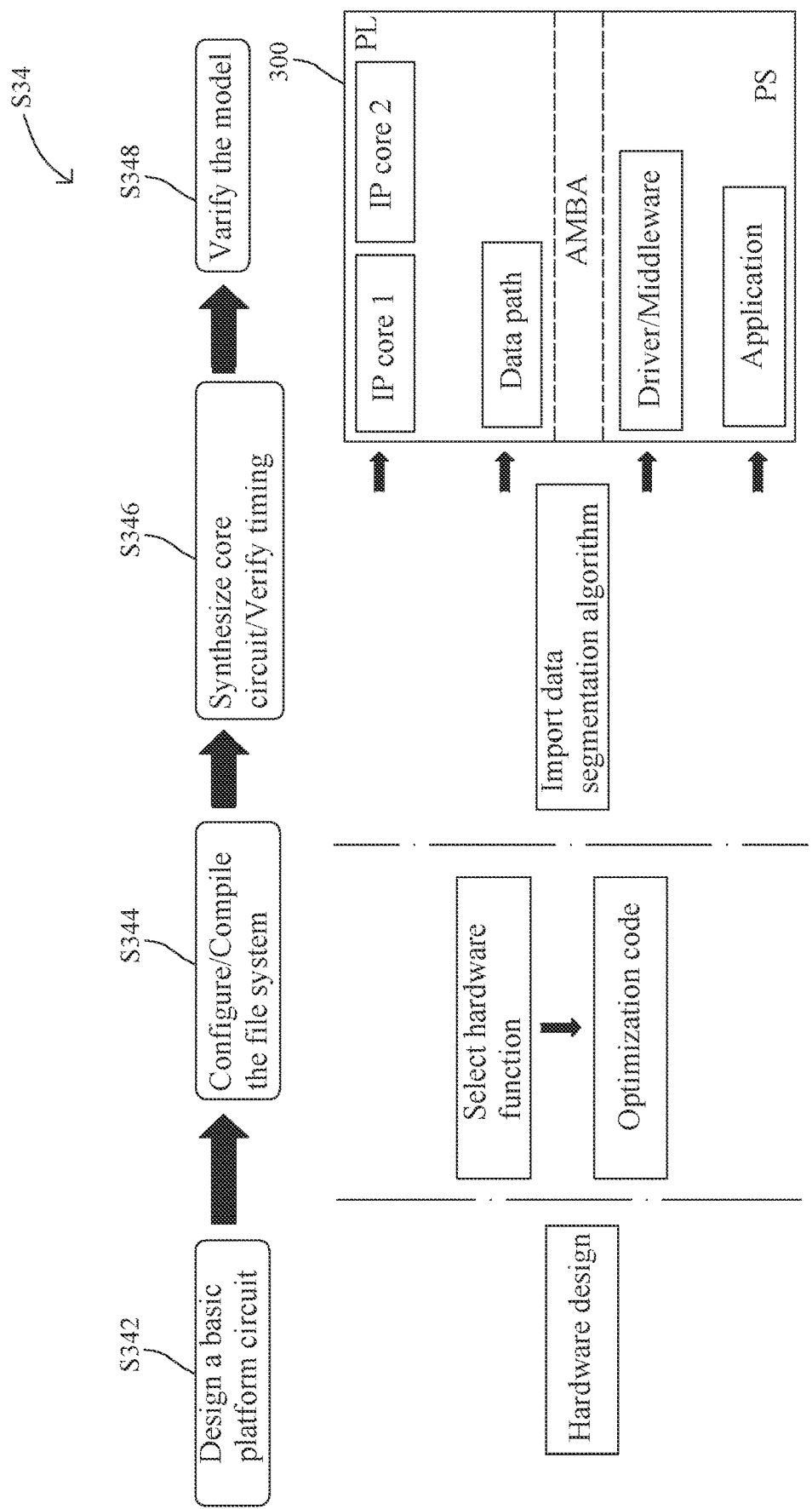
FIG. 3 shows the four design stages of a system on chip according to an embodiment of the present invention.

Also in the application runtime stage (S30), according to the selected circuit description file, a software-defined system on chip (referred to "SDSoC") is reconfigured (S34) by executing the four design stages (S342, S344, S346, S348) shown in FIG. 3, to form an acceleration unit that can more efficiently process the above-determined model data format, and make the acceleration unit suitable for processing a systolic array-based data segmentation algorithm. Subsequently, perform a verification on the reconfigured chip (S35), then determine whether the reconfigured chip passes the verification or not (S36). If the verification fails, the neural network model is considered to be retrained (S40). Repeat the above steps S31-S36 in the application runtime stage (S30) to dynamically reconfigure the chip.

Through the above method, when a different model data format is determined, the chip will be dynamically reconfigured into an efficient acceleration unit for the different model data format, thereby speeding up an inference process of the neural network model. It is worth mentioning that traditional FPGA deployments require pre-programming at the boot loader stage, which is usually a one-time installation before leaving the factory, or requires a cold shutdown and reprogramming. However, the present invention dynamically generates the reconfiguration circuit in the application runtime stage. And the process of dynamic reconfiguring circuit has no requirement of any power-off action because it belongs to the stage of the operating system executing the application programs.

FIG. 3 illustrates the four design stages of the chip (S342, S344, S346, S348). Initially, design a basic platform circuit with a design tool such as Vivado (S342). The stage (S342) is to design the hardware part of the chip. Furthermore, run the configuration and compilation of a file system related to the model data format with PetaLinux tools (S344), and the stage S344 includes the selection of the hardware function and the code optimization. Subsequently, perform the synthesis of core circuits and the timing verification with Vitis tools for the neural network model and an FPGA-based heterogeneous multi-core architecture (S346), and import the data segmentation algorithm at this stage. Finally, transplant these deployments like the aforementioned file system and core circuits to the basic platform circuit to form a target chip 300, and verify the target chip 300 (S348).

The target chip 300 shown in FIG. 3 has a hybrid dynamic circuit including a processing system (referred to as "PS") and a programmable logic (referred to as "PL"), and its basic platform circuit has an advanced microcontroller bus architecture (referred to as "AMBA"). One or more core circuits, such as IP core 1 and/or IP core 2, and related data paths are implanted in the PL. For example, the IP core 1 includes a circuit logic related to the data segmentation algorithm described in the embodiment of FIG. 4, and can cooperate with a framework to execute a data segmentation algorithm based on the systolic array. In addition, one or more IP cores 2 with other functions may be employed for different product planning. The PS part is used to perform related operations of the driver, middleware (also known as "intermediary software") and application programs.

Figure 4:
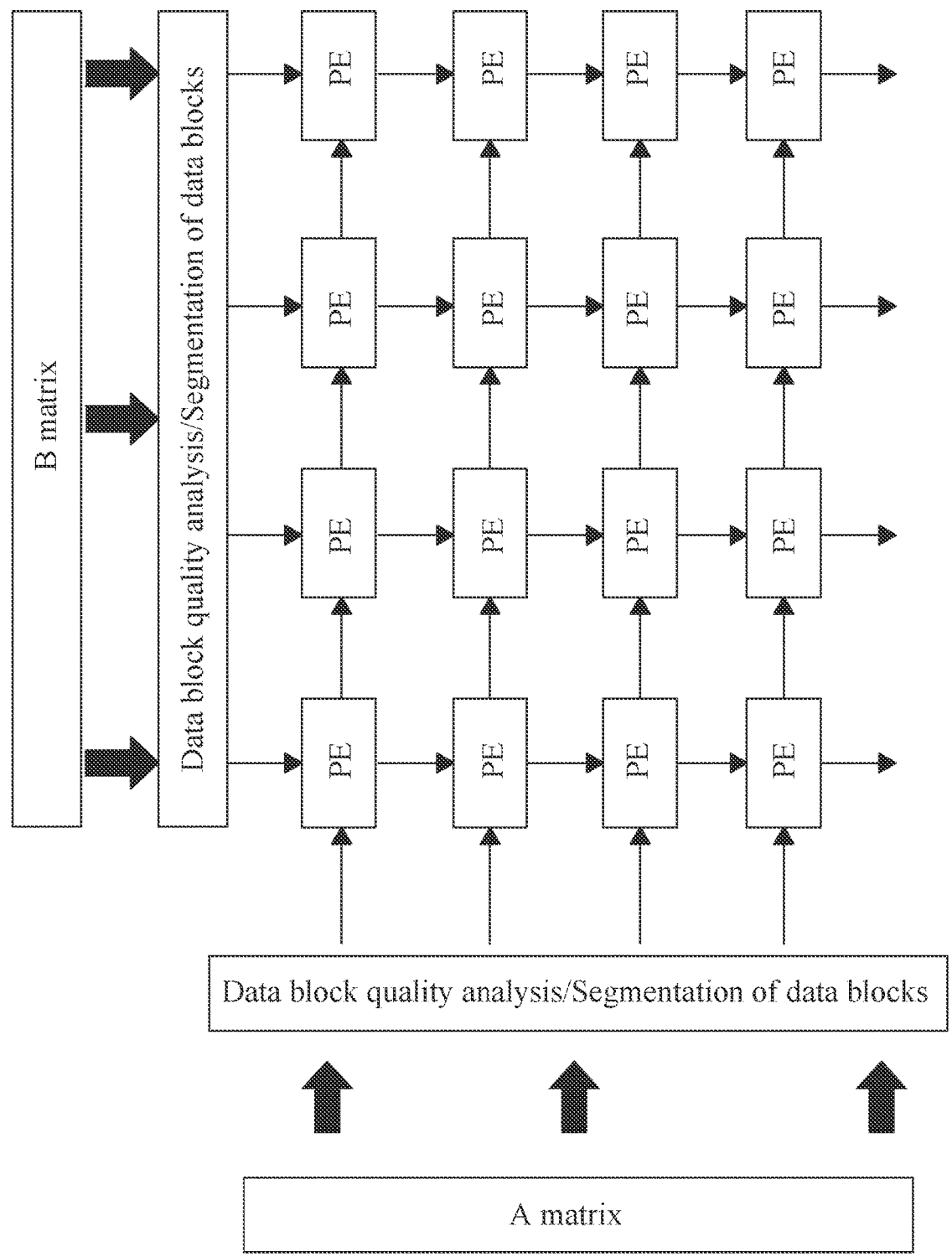
FIG. 4 is a schematic diagram of the circuit logic design of a data segmentation algorithm according to an embodiment of the present invention.

The embodiment of FIG. 4 illustrates the circuit logic design of a data segmentation algorithm. The data segmentation algorithm is proposed to overcome the hardware throughput limitation in the traditional domain specific system-on-chip of PS/PL hybrid operations. First, an A matrix and a B matrix are input into the data segmentation algorithm. Next, the data segmentation algorithm divides the A matrix into a plurality of first data blocks and divides the B matrix into a plurality of second data blocks, subsequently, analyzes the quality of the first data blocks and the second data blocks, respectively. In the embodiment, both the first data blocks and the second data blocks are partitioned matrices. The plural partitioned matrices divided from the A matrix and the B matrix are passed through multiple processing elements (referred to as "PE") to perform a matrix multiplication operation.

For the development and verification of the PS/PL hybrid operation, the data segmentation algorithm of the embodiment uses the systolic array as its basic operation method, and performs a design of the matrix multiply unit (referred to as MMU). The maximum value of the MMU design in the embodiment is 32×32, so that the MMU includes 1,024 multiply accumulators (referred to as MAC) in total. Each of the multiply accumulators may multiply two input numbers and then accumulate the result of this multiplying round with the result of the previous multiplying round, thereby realizing the matrix multiplication performed through the PE. It should be noted that the maximum of MMU design is not limited to 32×32. If there is a better hardware manufacturing process, then more multiply accumulators can be designed, so that the upper limit of MMU design can be increased. In one embodiment, in order to synthesize the logic circuit which is used in matrix multiplication related to the data format such as int 8, int 16, int 32, float 8, float 16, float 32, BFloat16, etc., the developer may use logic gates to synthesize the logic circuit by himself or directly utilize the intellectual property from the IP industry.

Figure 5:
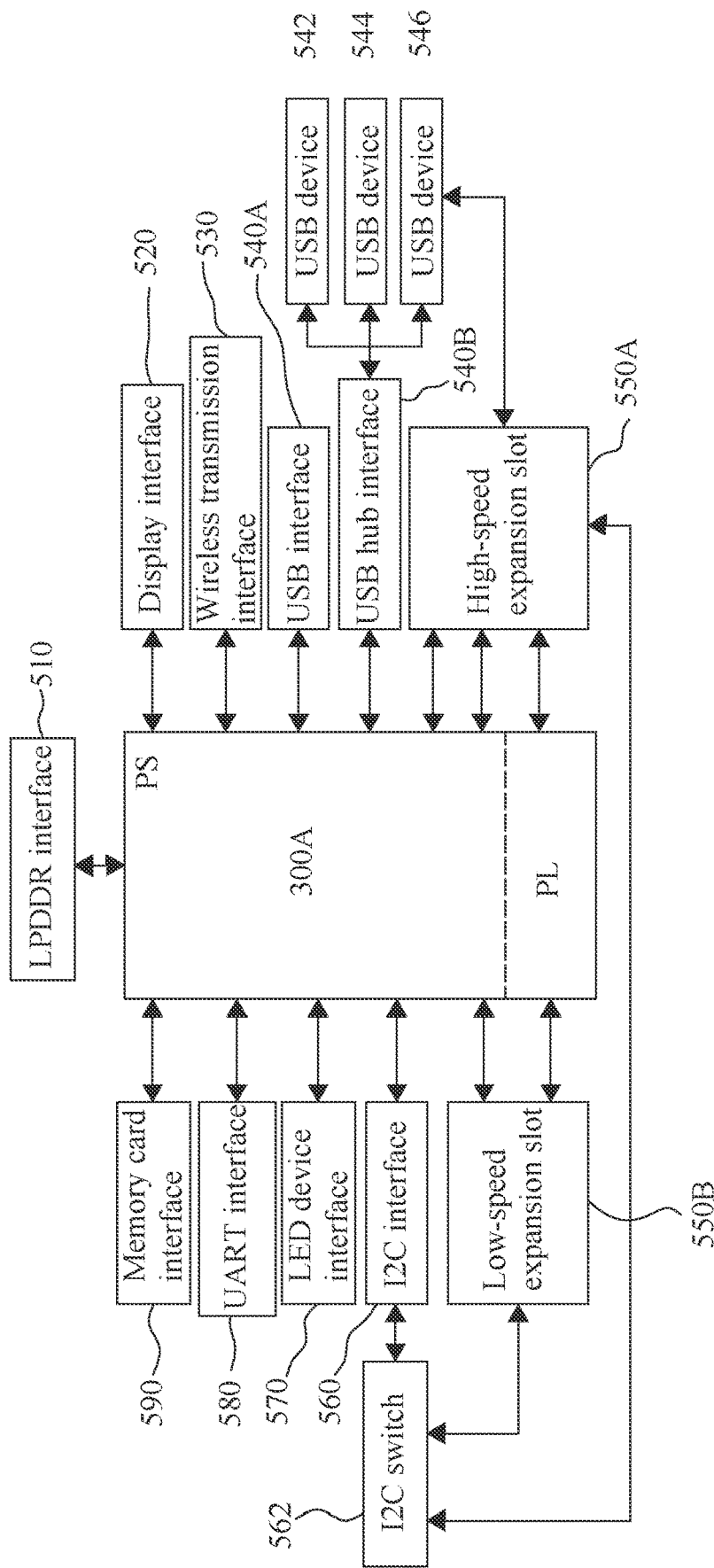
FIG. 5 is a schematic diagram of an embodiment applying the present invention.

FIG. 5 shows one embodiment performing the dynamic design method of the present invention on a commercially chip, such as Xilinx Zynq UltraScale+MPSoC ZU3EG A484, to form a software-defined system core chip 300A. The system core chip 300A is matched with a mainboard, such as the Ultra96-V2 Development Board designed by Avnet, as the peripheral I/O interface for verification. The mainboard includes a low power double data rate (referred to as LPDDR) interface 510, a display interface 520, a wireless transmission interface 530, a universal serial bus (referred to as USB) interface 540A, a USB hub interface 540B, a high-speed expansion slot 550A, a low-speed expansion slot 550B, an inter-integrated circuit (referred to as I2C) interface 560, a portable LED device interface 570, a universal asynchronous receiver/transmitter (referred to as UART) interface 580, and a memory card interface 590. The USB hub interface 540B is connected to three USB devices 542, 544, 546; the low-speed expansion slot 550B and the I2C interface 560 are both connected to an I2C switch 562.

Figure 5B:
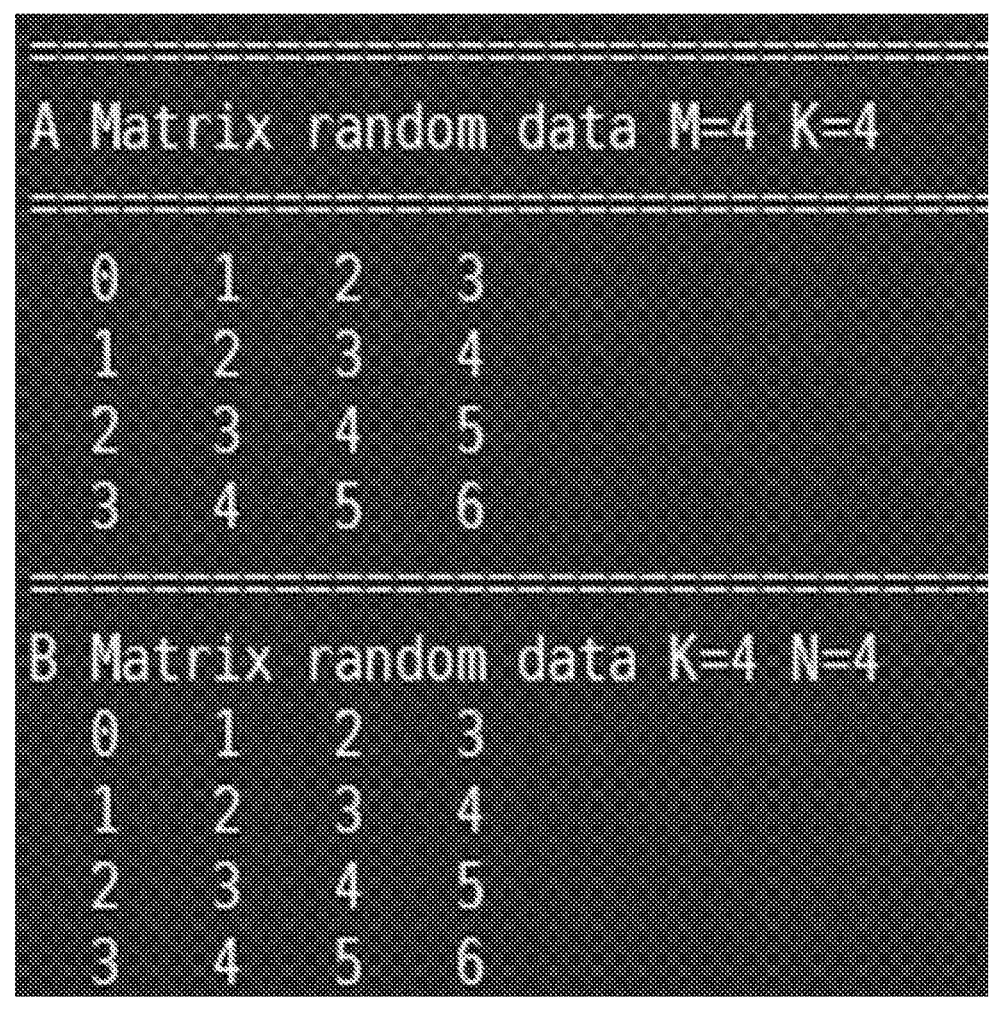

FIG. 5A shows a screen of the software-defined system core chip 300A and its operating system at the stage of executing an application program. FIG. 5B shows the input content of A matrix and B matrix. FIG. 5C shows the operation result of the A matrix and the B matrix shown in FIG. 5B through the system core chip 300A to execute the data segmentation algorithm of the present invention.

The above embodiments are based on a heterogeneous multi-core hardware architecture, such as a combination of FPGA plus software-defined system on chip, to perform matrix multiplication verification. Through dynamic planning, the circuit of the software-defined system on chip is reconfigured to become an efficient processor of a specific data format, to realize the development and verification of the PS/PL hybrid operations on the domain specific system-on-chip. Besides the combination of FPGA plus software-defined system on chip, the concept of the present invention is also applicable to other heterogeneous multi-core hardware architectures formed by combining the software-defined system on chip with a graphics processing units (referred to as GPU), a digital signal processor (referred to as DSP), a network processing unit (referred to as NPU), a ASIC or a CPU architecture.

The present invention proposes a data segmentation algorithm to improve the PS/PL hybrid operation. It solves the throughput limitation of the hardware in the systolic array operation, and rises the overall hybrid operation efficiency. The hybrid dynamic circuit of the present invention is based on a widespread AMBA interface to design the basic platform circuit, and through dynamic planning the circuit of the software-defined system on chip to form a domain specific system-on-chip. Therefore, the present invention is suitable for performing the operation of the data types of int 8, int 16, int 32, float 8, float 16, float 32, BFloat16, etc. in parallel with the synthesis of logic circuits, so as to increase computing performance and optimize the computing power configuration for the algorithm of overall circuit model. Therefore, it can improve the speed of matrix computing and reduce the number of logic need to be synthesized.

In summary, the present invention has the following characteristics:
1. Dynamic reconfiguring the circuit;
2. Adaptive circuit planning to optimize the computing power configuration for the algorithm of overall circuit model on the domain specific system-on-chip;
3. Providing a design method of hybrid dynamic circuit based on silicon intellectual property;
4. Designing circuit based on the AMBA standard for wide use.

The present invention is a prototype development of chip design for Silicone IP and also a widespread architecture of next-generation computing circuit. It provides a computing integration method for edge computing chips in the field of artificial intelligence (referred to as AI), cloud training chips and the chips of original consumer electronics such as smart phones, set-top boxes, internet protocol cameras, etc. In addition, it realizes the domain specific system-on-chip to provide widely used computing architecture solutions related the fields of telemetry and unmanned applications such as automated industry, drone, robot, the artificial intelligence of things (referred to as AIoT), etc.

Based on the above reasons, the present invention have different technical features from the traditional technology, and it is difficult for a person having ordinary skill in the art to come up with the concept of the present invention based on the teaching of the traditional technologies, so the present invention should conform to novelty and non-obviousness.

The foregoing descriptions of the preferred embodiments of the present invention have been provided for the purposes of illustration and explanations. It is not intended to be exclusive or to confine the invention to the precise form or to the disclosed exemplary embodiments. Accordingly, the foregoing descriptions should be regarded as illustrative rather than restrictive. Obviously, many modifications and variations will be apparent to professionals skilled in the art. The embodiments are chosen and described in order to best explain the principles of the invention and its best mode for practical applications, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary to confine the scope defined by the claims to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules on the requirement of an abstract for the purpose of conducting survey on patent documents, and should not be used to interpret or limit the scope or meaning of the claims. Any advantages and benefits described hereto may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A dynamic design method to improve adaptability of acceleration units to neural networks, wherein the method is implemented on an electronic device installed with an operating system and performed without power-off action, wherein the operating system is for executing application programs during a runtime stage, the method comprising steps of:

generating a plurality of different circuit description files through a neural network model, wherein each of the different circuit description files defines a data format corresponding to an hardware acceleration unit for the neural network model and a circuit logic related to a data segmentation algorithm, wherein the hardware acceleration unit comprises a software-defined hardware chip;

employing a software framework to interpret a model data format of weight values of the neural network model through a process of reading the weight values of the neural network model during the runtime stage of the operating system;

comparing the model data format with the data format defined in each of the different circuit description files to select one circuit description file from the different circuit description files by the software framework during the runtime stage; and reconfiguring a circuit of the software-defined hardware chip during the runtime stage according to the one circuit description file, so as to dynamically form a reconfigured chip as a reconfigured-hardware acceleration unit adapted to the model data format for the neural network model, wherein the reconfigured chip comprises the circuit logic suitable for running the data segmentation algorithm.

2. The method of claim 1, wherein the model data format and the data format corresponding to the hardware acceleration unit are respectively selected from a group consisting of int 8, int 16, int 32, float 8, float 16, float 32 and BFloat16.

3. The method of claim 1, wherein reconfiguring the circuit of the software-defined hardware chip comprises steps of: providing a basic platform circuit having an advanced microcontroller bus architecture; configuring a file system related to the model data format; synthesizing a core circuit according to the circuit logic related to the data segmentation algorithm; and transplanting the file system and the core circuit to the basic platform circuit to form the reconfigured hardware acceleration unit.

4. The method of claim 1, wherein the data segmentation algorithm comprises:

providing a first matrix and a second matrix;

dividing the first matrix into a plurality of first data blocks, and dividing the second matrix into a plurality of second data blocks; and performing a matrix multiplication operation on the first data blocks and the second data blocks through a plurality of processing elements.

5. The method of claim 1, wherein the hardware acceleration unit comprises a heterogeneous multi-core architecture.

6. The method of claim 5, wherein the heterogeneous multi-core architecture comprises a hybrid dynamic circuit including a processing system and a programmable logic.

* * * * *